US012615984B2

(12) United States Patent
Kang et al.

(10) Patent No.: US 12,615,984 B2
(45) Date of Patent: Apr. 28, 2026

(54) METHOD FOR IMPROVING RESIDUE FORMATION AFTER MANDREL REMOVAL

(71) Applicant: Shanghai Huali Integrated Circuit Corporation, Shanghai (CN)

(72) Inventors: Tianchen Kang, Shanghai (CN); Liyuan Liu, Shanghai (CN); Pengkai Xu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 258 days.

(21) Appl. No.: 18/660,289

(22) Filed: May 10, 2024

(65) Prior Publication Data

US 2024/0429059 A1      Dec. 26, 2024

(30) Foreign Application Priority Data

Jun. 20, 2023      (CN) .......................... 202310736001.1

(51) Int. Cl.
| | |
|---|---|
| *H10P 50/00* | (2026.01) |
| *H10P 50/24* | (2026.01) |
| *H10P 50/28* | (2026.01) |
| *H10P 76/20* | (2026.01) |

(52) U.S. Cl.
CPC .......... *H10P 50/695* (2026.01); *H10P 50/242* (2026.01); *H10P 50/283* (2026.01); *H10P 76/2041* (2026.01)

(58) Field of Classification Search
CPC ............................... H10P 50/20; H10P 50/268
See application file for complete search history.

(56) References Cited

U.S. PATENT DOCUMENTS

| | | | | |
|---|---|---|---|---|
| 2015/0087149 A1* | 3/2015 | He | ...................... | H10P 76/4088 |
| | | | | 438/696 |
| 2016/0254369 A1* | 9/2016 | Yi | ........................ | H10D 30/024 |
| | | | | 438/696 |

* cited by examiner

*Primary Examiner* — Thomas T Pham
(74) *Attorney, Agent, or Firm* — Banner & Witcoff, Ltd.

(57)      ABSTRACT

The present disclosure provides a method for improving residue formation after mandrel removal, including steps of: providing a TEOS layer, forming mandrel structures spaced apart from each other on the TEOS layer, and forming spacers on sidewalls of each of the mandrel structures; forming a first SOC layer to cover the surface of the TEOS layer, the mandrel structures, and the spacers of the mandrel structures, and forming a SOC structure that covers the spacers and exposes the top surfaces of the mandrel structures; removing the mandrel structures by etch along sidewalls of SOC structure, forming a first groove between two of the spacers on the sidewalls of the removed mandrel structures; forming a second SOC layer to cover the SOC structure and fill the first groove; performing top planarization of the second SOC layer until the top surface of the SOC structure is exposed.

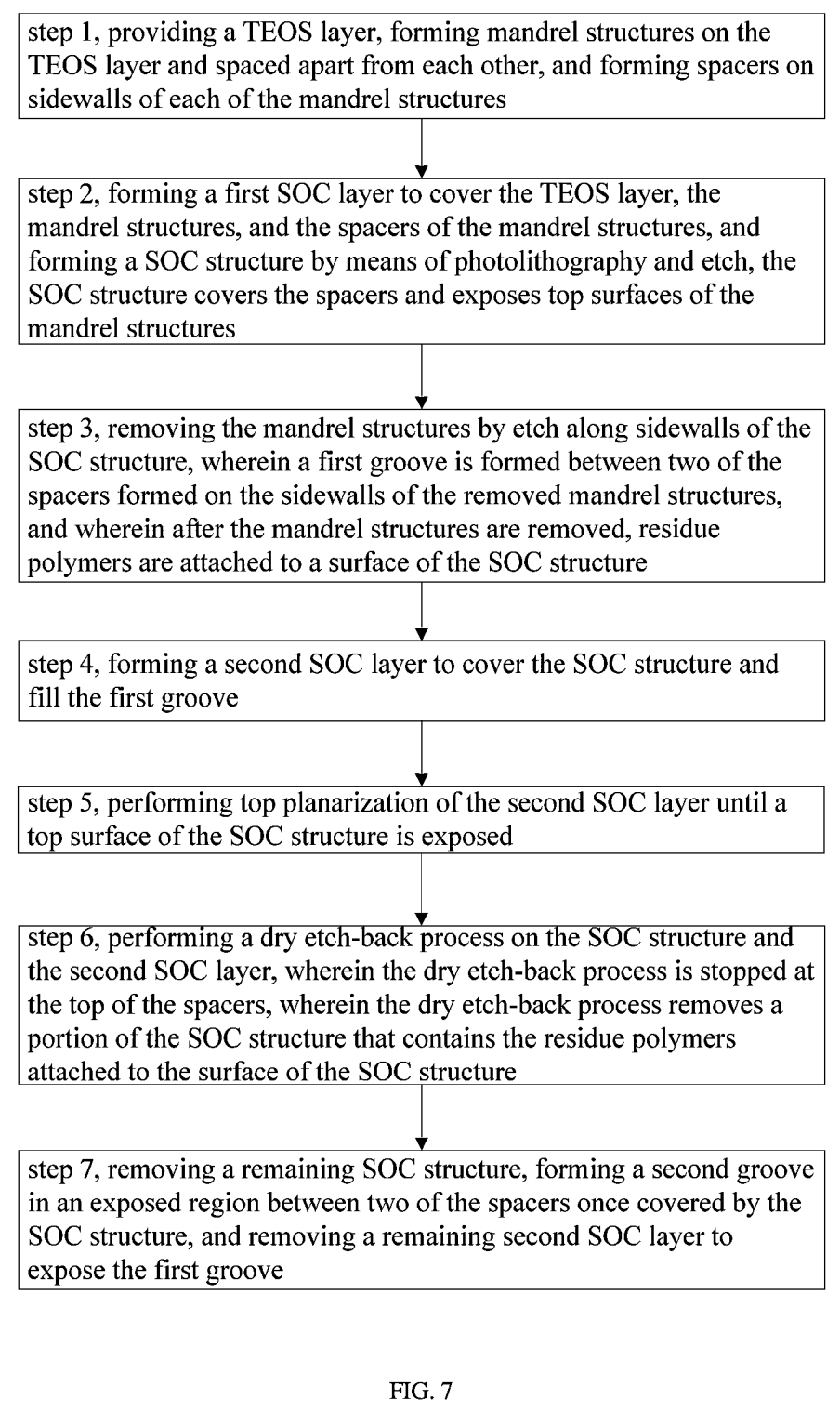

8 Claims, 4 Drawing Sheets step 1, providing a TEOS layer, forming mandrel structures on the
TEOS layer and spaced apart from each other, and forming spacers on
sidewalls of each of the mandrel structures step 2, forming a first SOC layer to cover the TEOS layer, the
mandrel structures, and the spacers of the mandrel structures, and
forming a SOC structure by means of photolithography and etch, the
SOC structure covers the spacers and exposes top surfaces of the
mandrel structures step 3, removing the mandrel structures by etch along sidewalls of the
SOC structure, wherein a first groove is formed between two of the
spacers formed on the sidewalls of the removed mandrel structures,
and wherein after the mandrel structures are removed, residue
polymers are attached to a surface of the SOC structure step 4, forming a second SOC layer to cover the SOC structure and
fill the first groove step 5, performing top planarization of the second SOC layer until a
top surface of the SOC structure is exposed step 6, performing a dry etch-back process on the SOC structure and
the second SOC layer, wherein the dry etch-back process is stopped at
the top of the spacers, wherein the dry etch-back process removes a
portion of the SOC structure that contains the residue polymers
attached to the surface of the SOC structure step 7, removing a remaining SOC structure, forming a second groove
in an exposed region between two of the spacers once covered by the
SOC structure, and removing a remaining second SOC layer to
expose the first groove

FIG. 7

METHOD FOR IMPROVING RESIDUE FORMATION AFTER MANDREL REMOVAL

CROSS-REFERENCE TO RELATED APPLICATIONS

This application claims priority to Chinese patent application No. 202310736001.1, filed on Jun. 20, 2023, the disclosure of which is incorporated herein by reference in its entirety.

TECHNICAL FIELD

The present disclosure relates to the technical field of semiconductors, and in particular to a method for improving residue formation after mandrel removal.

BACKGROUND

As semiconductor technologies have developed to the 28 nm node and below, the double patterning process has been widely applied because of its ability to effectively reduce critical features' linewidth. In this technique, a mandrel that meets linewidth and morphology requirements is formed first, and then a mask layer that meets a dimensional requirement is applied through a process including spacers formation and mandrel removal, to form a final small linewidth structure.

Currently, an amorphous silicon mandrel is typically applied from its ability to effectively control the linewidth and morphology. In the double patterning technique, a sandwich structure is often used to directly form the amorphous silicon mandrel by etching the amorphous silicon to form a mandrel, then growing a layer of TiO on the surface of the mandrel, finally forming amorphous silicon and a TiO hard mask through spacers etching and mandrel removal.

In the practical production process, after the amorphous silicon is etched, silicon-carbon polymers tend to accumulate on the surface after a spin-on-carbon (SOC) step and are often hard to remove, forming residues after a later step of in-situ ashing (ASH), thus resulting in defects in subsequent processes. Furthermore, although over-enhanced ASH may remove the residues, it causes a loss of the TiO layer thickness, which is unfavorable to the transfer of a lower layer pattern.

BRIEF SUMMARY

The present disclosure provides a method for improving residue formation after amorphous silicon mandrel removal in a self-aligned double patterning process, which is caused by polymers left on the surface of a spin-on-carbon layer turning into defects in subsequent ashing, which affects the lower layer pattern transfer.

This method for improving residue formation after mandrel removal at least includes:

step 1, providing a tetraethyl orthosilicate (TEOS) layer, wherein mandrel structures spaced apart from each other are formed on the TEOS layer, and spacers is formed to sidewalls of each of the mandrel structures;

step 2, forming a first SOC layer to cover the surface of the TEOS layer, the mandrel structure, and the spacers of the mandrel structure, and forming a SOC structure by means of photolithography and etch, the SOC structure covers the spacers and exposes the top of the mandrel structure;

step 3, removing the mandrel structure by etch along a sidewall of the SOC structure, wherein a first groove is formed between the spacers attached to the sidewalls of the removed mandrel structure, and after the mandrel structure is removed, there are polymers left on the surface of the SOC structure;

step 4, forming a second SOC layer to cover the SOC structure and fill the first groove;

step 5, performing top planarization of the second SOC layer until the top surface of the SOC structure is exposed;

step 6, performing a dry etch-back process on the SOC structure and the second SOC layer, wherein the dry etch-back process removes a portion of the SOC structure that containing the polymers left on the surfaces of the SOC structure, and the dry etch-back process is stopped at the top surfaces of the spacers thereof; and step 7, removing the remaining SOC structure and the remaining second SOC layer, wherein after the remaining SOC structure is removed, a region between the spacers once covered by the SOC structure is exposed to form a second groove, and at the same time, the first groove between two of the SOC structures is exposed after the remaining second SOC layer is removed.

In an example, a method of forming the spacers in step 1 includes: (1) depositing a hard mask layer on the TEOS layer to cover the mandrel structure; and (2) removing the hard mask layer on the TEOS layer and the hard mask layer on the top of the mandrel structure, and forming the spacers on the sidewalls of the mandrel structure by the hard mask layer retained on the sidewalls.

In an example, the mandrel structure in step 1 comprises amorphous silicon.

In an example, the hard mask layer in step (2) comprises TiO.

In an example, a method of forming the SOC structure in step 2 includes: (a) forming a bottom anti-reflection coating layer on the first SOC layer and a photoresist layer on the bottom anti-reflection coating layer; (b) performing exposure and development to form a photoresist pattern used for etching the mandrel structure; and (c) etching the first SOC layer according to the photoresist pattern to form the SOC structure that covers the spacers and exposes the top surface of the mandrel structure.

In an example, the polymers attached to the surface of the SOC structure in step 3 are residue carbon-silicon polymers produced during a process of removing the mandrel structure by etch.

In an example, the remaining SOC structure and the remaining second SOC layer are removed in step 7 using a one step in-situ ashing method.

In an example, a lateral thickness of the spacers in step 3 is about 120 Å.

As stated above, the method for improving residue formation after mandrel removal of the present disclosure has the following beneficial effects: in the method of the present disclosure, cover twice the SOC layers to refill the etched groove and implement planarization, followed by dry etch-back of the SOC layers to remove most of the SOC containing the silicon-carbon polymers, then the SOC layers are removed by means of one step in-situ ashing, thus, the problem of residue retention between sidewalls gaps is improved finally, avoiding an excessive loss of a hard mask thickness.

BRIEF DESCRIPTION OF THE DRAWINGS

FIG. 7 is a flowchart of the method for improving residue formation after mandrel removal in the present disclosure.

DETAILED DESCRIPTION OF THE DISCLOSURE

The embodiments of this application will be described below through specific examples. Those skilled in the art can easily understand the other advantages and effects of this application from the content disclosed in this description. This application may also be implemented or applied through other different specific implementation modes, and the details in this description may be modified or changed based on different perspectives and applications without deviating from the spirit of this application.

Referring to FIG. 1 to FIG. 7. It should be noted that the drawings provided in the embodiments are only used to illustrate the basic concept of the present disclosure in a schematic way, so the drawings only show the components related to the present disclosure rather than being drawn according to the number, shape, and size of the components in actual implementations. The type, number, and proportion of various components can be changed in the actual implementations, and the layout of the components may be more complicated.

The present disclosure provides a method for improving residue formation after mandrel removal, referring to FIG. 7, at least including the following steps.

Figure 1:
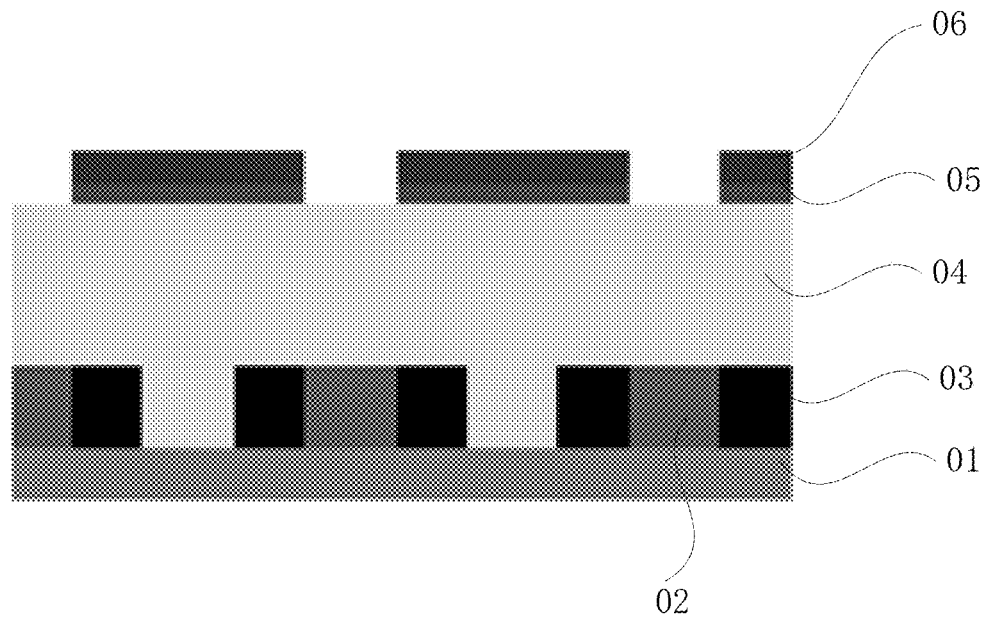
FIG. 1 to FIG. 6 are schematic diagrams of structures formed in steps of a method for improving residue formation after mandrel removal in the present disclosure.

Step 1. Provide a tetraethyl orthosilicate (TEOS) layer, where mandrel structures spaced apart from each other are formed on the TEOS layer, and spacers are formed to sidewalls of each of the mandrel structures. Referring to FIG. 1, in step 1, the mandrel structures 02 spaced apart from each other are formed on the TEOS layer 01, and the spacers 03 are formed to sidewalls of each of the mandrel structures 02.

Furthermore, in this embodiment of the present disclosure, a method of forming the spacers 03 in step 1 include: (1) depositing a hard mask layer on the TEOS layer 01 to cover the mandrel structure; and (2) removing the hard mask layer from the TEOS layer and the hard mask layer from the top surface of the mandrel structure, while the hard mask layer is retained on the sidewalls of the mandrel structure and spacers are thus formed.

Furthermore, in this embodiment of the present disclosure, the mandrel structure 02 in step 1 comprises amorphous silicon.

Furthermore, in this embodiment of the present disclosure, the hard mask layer in step (2) comprises TiO.

Figure 2:
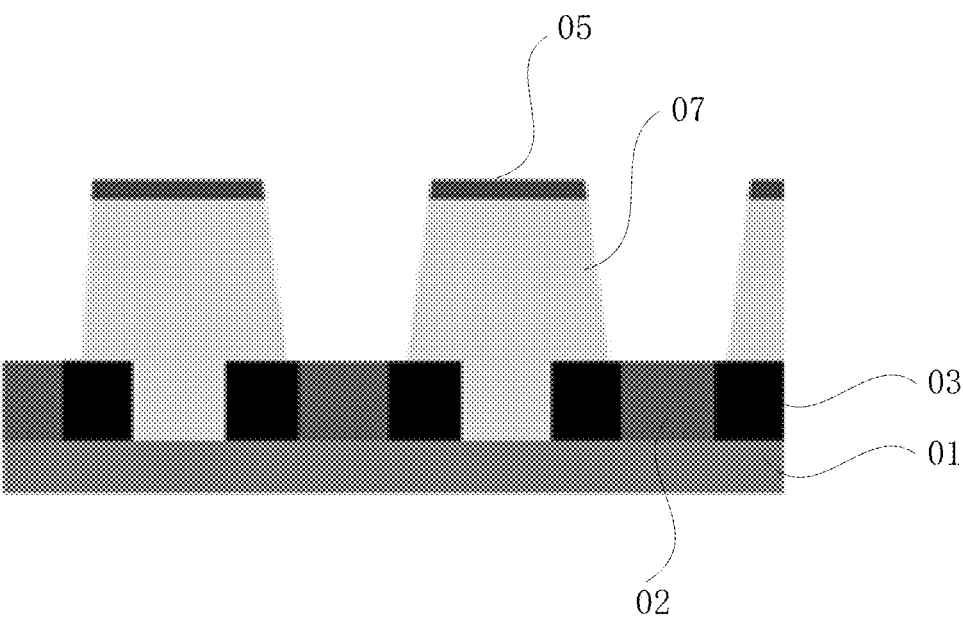

Step 2. Form a first SOC layer to cover the surface of the TEOS layer, the mandrel structure, and the spacers of the mandrel structure, and form, by means of photolithography and etch, a SOC structure that covers the spacers and exposes the top of the mandrel structure. Referring to FIG. 1, in step 2, the first SOC layer 04 is formed to cover the surface of the TEOS layer 01, the mandrel structure 02, and the spacers 03 of the mandrel structure. Referring to FIG. 2, the SOC structure 07 that covers the spacers 03 and exposes the top of the mandrel structure 02 is formed by means of the photolithography and etch. The SOC layer in of the present disclosure is a spin-on-carbon (SOC) layer.

Furthermore, in this embodiment of the present disclosure, a method of forming the SOC structure 07 in step 2 includes: (a) forming a bottom anti-reflection coating layer on the first SOC layer 04 and a photoresist on the bottom anti-reflection coating; (b) performing exposure and development to form a photoresist pattern 06 used for etching the mandrel structure (the developed bottom anti-reflection coating layer 05 is located below the photoresist pattern 06); and (c) etching the first SOC layer 04 according to the photoresist pattern 06 to form the SOC structure 07 that covers the spacers 03 and exposes the top surface of the mandrel structure 02. Referring to FIG. 2, after the SOC structure 07 is formed, there is the bottom anti-reflection coating layer 05 remained on the top of the SOC structure 07.

Figure 3:
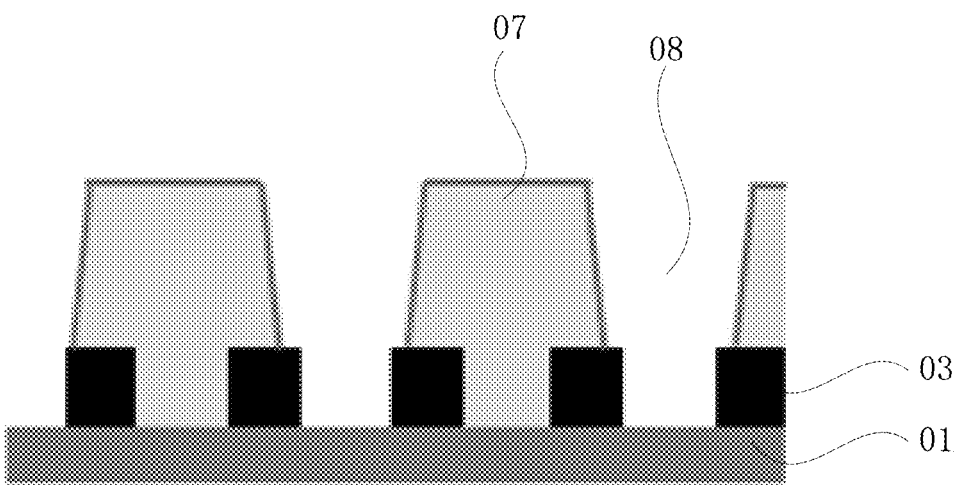

Step 3. Remove the mandrel structure by etch on the sidewalls of the SOC structure, where a first groove is formed between the spacers formed on the sidewalls of the removed mandrel structure, and after the mandrel structure is removed, there are polymers attached to the surface of the SOC structure. Referring to FIG. 3, in step 3, the mandrel structure is removed by etch along the sidewalls of the SOC structure 07, where the first groove 08 is formed between the spacers 03 formed on the sidewalls of the removed mandrel structure, and after the mandrel structure is removed, there is the polymers attached to the surface of the SOC structure 07.

Furthermore, in this embodiment of the present disclosure, the polymers attached to the surface of the SOC structure in step 3 are carbon-silicon polymers produced during a process of removing the mandrel structure by etch.

Furthermore, in this embodiment of the present disclosure, a lateral thickness of the spacers 03 in step 3 is 120 Å. The lateral thickness of the spacers 03 in FIG. 1 to FIG. 3 is the spacer's width in a left-right direction.

Figure 4:
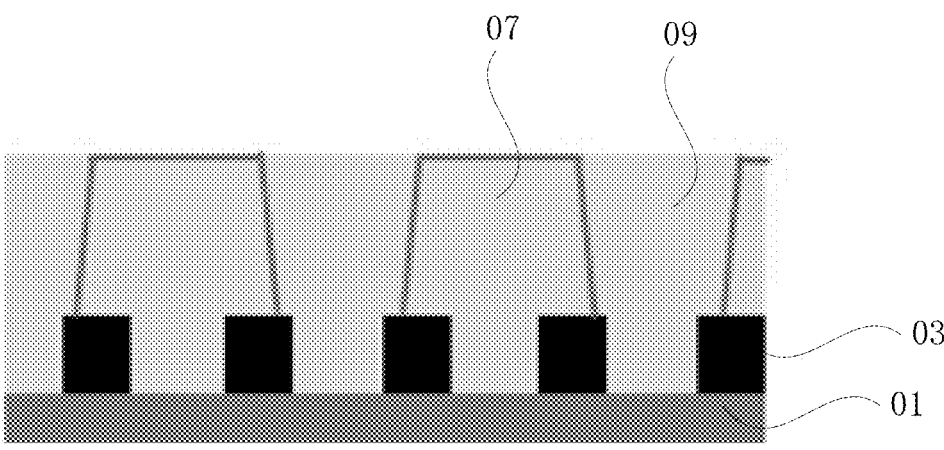

Step 4. Form a second SOC layer to cover the SOC structure and fill the first groove. Referring to FIG. 4, the second SOC layer 09 is formed to cover the SOC structure and fill the first groove.

Step 5. Perform top planarization of the second SOC layer until the top surface of the SOC structure is exposed. Referring to FIG. 4, in step 5, the top planarization of the second SOC layer 09 is performed until the top surface of the SOC structure 07 is exposed.

Figure 5:
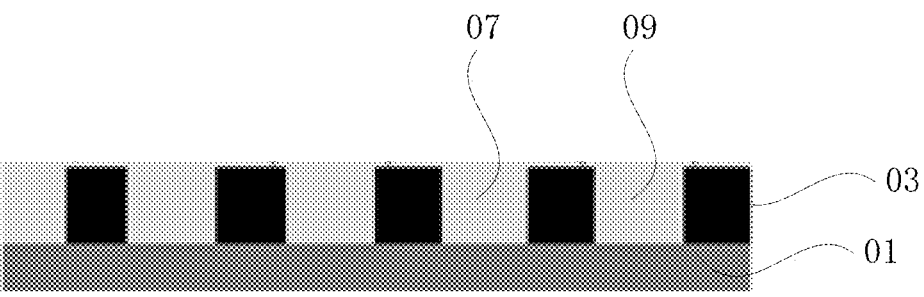

Step 6. Perform a dry etch-back process on the SOC structure and the second SOC layer, where the etch-back process removes a portion of the SOC structure that contains the polymers attached to the surface thereof and is stopped at the top surfaces of the spacers. Referring to FIG. 5, in step 6, the dry etch-back process is performed on the SOC structure 07 and the second SOC layer 09, where the dry etch-back process is stopped at the top surfaces of the spacers 03 and it removes a portion of the SOC structure that contains the polymers attached to the surface thereof. As such, after performing the dry etch-back process on the SOC structure in step 6, the polymers attached to the surface of the SOC structure are also removed.

Figure 6:
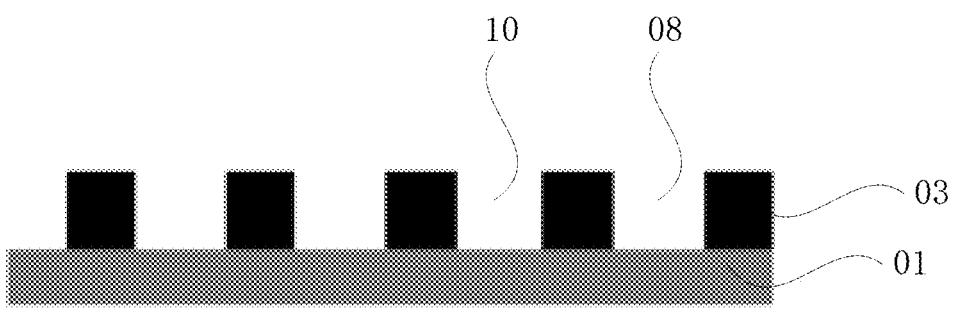

Step 7. Remove the remaining SOC structure and the remaining second SOC layer, where after the remaining SOC structure is removed, a region between two of the spacers once covered by the SOC structure is exposed and forms a second groove, and the first groove is exposed after the remaining second SOC layer is removed. Referring to FIG. 6, in step 7, the remaining SOC structure 07 and the remaining second SOC layer 09 as shown in FIG. 5 are removed, where after the remaining SOC structure 07 is removed, the region between two of the spacers 03 once covered by the SOC structure 07 is exposed to form the second groove 10, and the first groove 08 is exposed after the remaining second SOC layer 09 is removed. As can be seen from FIG. 6, after removing the mandrel structure 02 in step 1, through step 7, the spacers 03 are spaced apart from each other and have half of the original linewidth structures provided by the first or the second groove alone.

Furthermore, in this embodiment of the present disclosure, the remaining SOC structure and the remaining second SOC layer are removed in step 7 using a later one step in-situ ashing (ASH) method.

In the present disclosure, the SOC layer is covered several times to refill the etched grooves and implement planarization, followed by etch-back of the SOC to remove most of the SOC materials containing the silicon-carbon polymer molecules, then the SOC is removed by means of a later one step in-situ ashing, finally removing residues, avoiding the problem of an excessive loss of a hard mask thickness, and facilitating the transfer of a lower layer pattern.

To sum up, in the method of the present disclosure, cover twice SOC layer to refill the etched groove and implement planarization, followed by etch-back of the SOC to remove most of the SOC containing the silicon-carbon polymers, and then the SOC is removed by means of one step in-situ ashing, the problem of residue retention between sidewalls gap is improved finally, and avoiding the problem of an excessive loss of a hard mask thickness. Therefore, the present disclosure effectively overcomes various defects in the existing technique and has high industrial utilization value.

The above embodiments merely illustrate the principle and effect of the present disclosure, rather than limiting the present disclosure. Any person skilled in the art can modify or change the above embodiments without departing from the spirit and scope of the present disclosure. Therefore, all equivalent modifications or changes made by those with ordinary knowledge in the art without departing from the spirit and technical idea disclosed in the present disclosure shall still be covered by the claims of the present disclosure.

What is claimed is:

1. A method for improving residue formation after mandrel removal, at least comprising:

step 1, providing a tetraethyl orthosilicate (TEOS) layer, forming mandrel structures on the TEOS layer and spaced apart from each other, and forming spacers on sidewalls of each of the mandrel structures;

step 2, forming a first spin-on-carbon (SOC) layer to cover the TEOS layer, the mandrel structures, and the spacers of the mandrel structures, and forming an SOC structure by means of photolithography and etch, wherein the SOC structure covers the spacers and exposes top surfaces of the mandrel structures;

step 3, removing the mandrel structures by etch along sidewalls of the SOC structure, wherein a first groove is formed between two of the spacers formed on the sidewalls of the removed mandrel structures, and wherein after the mandrel structures are removed, residue polymers are attached to a surface of the SOC structure;

step 4, forming a second SOC layer to cover the SOC structure and fill the first groove;

step 5, performing top planarization of the second SOC layer until a top surface of the SOC structure is exposed;

step 6, performing a dry etch-back process on the SOC structure and the second SOC layer, wherein the dry etch-back process is stopped at the top of the spacers, wherein the dry etch-back process removes a portion of the SOC structure that contains the residue polymers attached to the surface of the SOC structure; and step 7, removing a remaining SOC structure, forming a second groove in an exposed region between two of the spacers once covered by the SOC structure, and removing a remaining second SOC layer to expose the first groove.

2. The method for improving residue formation after mandrel removal according to claim 1, wherein the forming the spacers in step 1 further comprises: (1) depositing a hard mask layer on the TEOS layer to cover the mandrel structures; and (2) removing the hard mask layer from the TEOS layer and removing the hard mask layer from the top surfaces of the mandrel structures, wherein a portion of the hard mask layer on the sidewalls of the mandrel structures is retained for forming the spacers.

3. The method for improving residue formation after mandrel removal according to claim 1, wherein the mandrel structures in step 1 comprise amorphous silicon.

4. The method for improving residue formation after mandrel removal according to claim 2, wherein the hard mask layer comprises TiO.

5. The method for improving residue formation after mandrel removal according to claim 1, wherein the forming the SOC structure in step 2 comprises: (a) forming a bottom anti-reflection coating layer on the first SOC layer and a photoresist layer on the bottom anti-reflection coating layer; (b) performing photolithographic exposure and development to form a photoresist pattern used for etching the mandrel structures; and (c) etching the first SOC layer according to the photoresist pattern to form the SOC structure that covers the spacers and exposes the top surfaces of the mandrel structures.

6. The method for improving residue formation after mandrel removal according to claim 1, wherein the residue polymers attached to the surface of the SOC structure in step 3 comprise carbon-silicon polymers produced during removing the mandrel structures by etch.

7. The method for improving residue formation after mandrel removal according to claim 1, wherein the remaining SOC structure and the remaining second SOC layer are removed in step 7 by a one step in-situ ashing technique.

8. The method for improving residue formation after mandrel removal according to claim 1, wherein a lateral thickness of one of the spacers in step 3 is about 120 Å.

* * * * *